(12) United States Patent
Chen

(10) Patent No.: US 12,274,121 B2
(45) Date of Patent: Apr. 8, 2025

(54) DISPLAY PANEL COMPRISING DAM STRUCTURE INCLUDING PLURALITY OF DAM LAYERS IN NON-DISPLAY AREA AND MOBILE TERMINAL

(71) Applicant: Wuhan China Star Optoelectronics Semiconductor Display Technology Co., Ltd., Wuhan (CN)

(72) Inventor: Chen Chen, Wuhan (CN)

(73) Assignee: Wuhan China Star Optoelectronics Semiconductor Display Technology CO., Ltd., Hubei (CN)

( * ) Notice: Subject to any disclaimer, the term of this patent is extended or adjusted under 35 U.S.C. 154(b) by 482 days.

(21) Appl. No.: 17/621,180

(22) PCT Filed: Dec. 10, 2021

(86) PCT No.: PCT/CN2021/136970
§ 371 (c)(1),
(2) Date: Dec. 20, 2021

(87) PCT Pub. No.: WO2023/087436
PCT Pub. Date: May 25, 2023

(65) Prior Publication Data
US 2023/0165038 A1    May 25, 2023

(30) Foreign Application Priority Data

Nov. 19, 2021  (CN) .......................... 202111399725.9

(51) Int. Cl.
*H04M 1/02* (2006.01)
*H10K 50/844* (2023.01)
(Continued)

(52) U.S. Cl.
CPC ........ *H10K 50/844* (2023.02); *H04M 1/0266* (2013.01); *H10K 59/122* (2023.02)

(58) Field of Classification Search
CPC .............. H04M 1/0266; H04M 1/0264; H10K 59/122; H10K 50/844; H10K 59/124; H10K 50/8426; H10K 2102/351
(Continued)

(56) References Cited

U.S. PATENT DOCUMENTS

2018/0069064 A1   3/2018 Ito et al.
2018/0122890 A1*  5/2018 Park ................... H10K 59/1315
(Continued)

FOREIGN PATENT DOCUMENTS

CN    108962947 A   12/2018
CN    109728194 A   5/2019
(Continued)

OTHER PUBLICATIONS

International Search Report in International application No. PCT/CN2021/136970, mailed on Aug. 16, 2022.
(Continued)

*Primary Examiner* — Didarul A Mazumder
(74) *Attorney, Agent, or Firm* — PV IP PC; Wei Te Chung

(57) ABSTRACT

The present application provides a display panel and a mobile terminal, including an array substrate; a dam structure; an organic layer group and a light-emitting layer sequentially stacked on the array substrate and in the display area. The dam structure includes a first dam layer and a second dam layer having a width less than or equal to a width of the first dam layer that are sequentially stacked over the array substrate. An absolute value of the difference between the thickness of the organic layer group and the thickness of the dam structure is less than or equal to the first predetermined threshold value.

9 Claims, 4 Drawing Sheets

(51) Int. Cl.
   *H10K 59/12*     (2023.01)
   *H10K 59/122*    (2023.01)
(58) Field of Classification Search
   USPC .................................. 257/40; 438/82, 99
   See application file for complete search history.

(56) References Cited

U.S. PATENT DOCUMENTS

| | | | |
|---|---|---|---|
| 2019/0074481 A1* | 3/2019 | Kim | H10K 77/10 |
| 2020/0161398 A1* | 5/2020 | Bang | H10K 59/1213 |
| 2020/0235337 A1* | 7/2020 | Liu | H10K 50/844 |
| 2021/0399262 A1* | 12/2021 | Woo | H10K 59/40 |

FOREIGN PATENT DOCUMENTS

| | | |
|---|---|---|
| CN | 110224006 A | 9/2019 |
| CN | 111063820 A | 4/2020 |
| CN | 111162194 A | 5/2020 |
| CN | 111653589 A | 9/2020 |
| CN | 112216599 A | 1/2021 |
| JP | 2005267917 A | 9/2005 |

OTHER PUBLICATIONS

Written Opinion of the International Search Authority in International application No. PCT/CN2021/136970, mailed on Aug. 16, 2022.
Chinese Office Action issued in corresponding Chinese Patent Application No. 202111399725.9 dated Jan. 20, 2023, pp. 1-6.

* cited by examiner

DISPLAY PANEL COMPRISING DAM STRUCTURE INCLUDING PLURALITY OF DAM LAYERS IN NON-DISPLAY AREA AND MOBILE TERMINAL

CROSS-REFERENCE TO RELATED APPLICATION

This application is a national phase application under 35 U.S.C. § 371 of PCT Application No. PCT/CN2021/136970 filed Dec. 10, 2021, which claims priority to Chinese Application No. 202111399725.9 filed Nov. 19, 2021, the contents of which are incorporated herein by reference in their entirety.

FIELD OF INVENTION

The present application relates to a display technology field, especially to a fabrication of display device, and particularly to a display panel and a fabrication method thereof, and a mobile terminal.

BACKGROUND

With the increasing demand for high-screen-to-body ratio products, a camera under panel (CUP) technology is thus emerged.

Among them, a camera area under a panel of a CUP product needs to use a transparent conductive material that is different from a metal material in other areas to ensure the shooting effect of the camera and the normal display effect of the camera area. At the same time, it is necessary to add an organic film layer for separating the organic film layer with other film layers. With the increase in the number of organic film layers, due to the strong fluidity of the organic film layer materials and the less width of the multi-layer organic film layer forming a dam structure, the organic film layer materials will overflow all around, resulting in a thickness of a final actual formation of the dam structure is much lower than a design value, which reduces a reliability of the dam structure.

Therefore, existing CUP products have the problem of a too low thickness of the dam structure, which is in urgent need of improvement.

SUMMARY OF DISCLOSURE

The embodiments of the present application provide a display panel and a mobile terminal to solve the existing thickness loss caused by the overflow of the upper organic film layer in a dam structure to the lower organic film layer, which results in technical problems with low reliability of the dam structure.

An embodiment of the preset application provides a display panel, wherein the display panel comprises a display area and a non-display area surrounding the display area, and the display panel comprises:

an array substrate;

a dam structure, wherein the dam structure is on the array substrate and in the non-display area, the dam structure comprises a plurality of dam layers which are stacked layer by layer, and the plurality of dam layers comprise a first dam layer on the array substrate and a second dam layer on the first dam layer, and a width of the second dam layer is less than or equal to a width of the first dam layer in a cross-section of the display panel;

an organic layer group on the array substrate and in the display area, and an absolute value of the difference between a thickness of the organic layer group and a thickness of the dam structure is less than or equal to a first predetermined threshold value; and a light-emitting layer on a side of the organic layer group away from the array substrate and in the display area;

wherein the array substrate comprises an inorganic layer group and a thin film transistor layer located at least in the inorganic layer group, and the organic layer group comprises:

a planarization layer on a side of the inorganic layer group close to the light-emitting layer;

a pixel definition layer on a side of the planarization layer close to the light-emitting layer;

a supporting layer on a side of the pixel definition layer close to the light-emitting layer;

wherein a difference between a gap from the side of the array substrate away from the supporting layer to the side of the supporting layer away from the array substrate and a gap from the side of the array substrate away from the dam structure to the side of the dam structure away from the array substrate is less than or equal to the first predetermined threshold value; and wherein the first predetermined threshold value is less than or equal to 2 micrometers.

In one embodiment, in a top view of the display panel, an edge of the second dam layer overlaps an edge of the first dam layer, or the edge of the second dam layer is within the first dam layer.

In one embodiment, in every two adjacent dam layers, a width of the dam layer farther from the array substrate is less than a width of the dam layer closer to the array substrate.

In one embodiment, at least one of the dam layers is provided in a layer of at least one of the planarization layer, the pixel definition layer, and the supporting layer, and a material of each of the dam layers is the same as a material of the planarization layer, the pixel definition layer or the supporting layer arranged in the same layer.

In one embodiment, a groove is provided in the first dam layer, and the second dam layer is in the groove.

In one embodiment, the dam structure further comprises:

at least one first overflow layer, wherein in at least one set of two adjacent dam layers, the overflow layer at least extends from the side of the dam layer away from the array substrate to the side of the dam wall layer close to the array substrate.

Another embodiment further provides a display panel, wherein the display panel comprises a display area and a non-display area surrounding the display area, and the display panel comprises:

an array substrate;

a dam structure, wherein the dam structure is on the array substrate and in the non-display area, the dam structure comprises a plurality of dam layers which are stacked layer by layer, and the plurality of dam layers comprise a first dam layer on the array substrate and a second dam layer on the first dam layer, and a width of the second dam layer is less than or equal to a width of the first dam layer in a cross-section of the display panel;

an organic layer group on the array substrate and in the display area, and an absolute value of the difference between a thickness of the organic layer group and a thickness of the dam structure is less than or equal to a first predetermined threshold value; and a light-emitting layer on a side of the organic layer group away from the array substrate and in the display area.

In one embodiment, the first predetermined threshold value is less than or equal to 2 micrometers.

In one embodiment, in a top view of the display panel, an edge of the second dam layer overlaps an edge of the first dam layer, or the edge of the second dam layer is within the first dam layer.

In one embodiment, in the cross-section of the display panel, a distance between a side of the second dam layer and a side of the first dam layer is less than or equal to a second predetermined threshold value.

In one embodiment, in every two adjacent dam layers, a width of the dam layer far from the array substrate is less than a width of the dam layer closer to the array substrate.

In one embodiment, the array substrate comprises an inorganic layer group and a thin film transistor layer located at least in the inorganic layer group, and the organic layer group comprises:

a planarization layer on a side of the inorganic layer group close to the light-emitting layer;

a pixel definition layer on a side of the planarization layer close to the light-emitting layer;

a supporting layer on a side of the pixel definition layer close to the light-emitting layer;

wherein a difference between a gap from the side of the array substrate away from the supporting layer to the side of the supporting layer away from the array substrate and a gap from the side of the array substrate away from the dam structure to the side of the dam structure away from the array substrate is less than or equal to the first predetermined threshold value.

In one embodiment, at least one of the dam layers is provided in a layer of at least one of the planarization layer, the pixel definition layer, and the supporting layer, and a material of each of the dam layers is the same as a material of the planarization layer, the pixel definition layer or the supporting layer arranged in the same layer.

In one embodiment, the planarization layer comprises:

a first planarization layer on the side of the inorganic layer group close to the light-emitting layer, and a conductive layer is provided on the first planarization layer; and a second planarization layer on the side of the first planarization layer and the conductive layer close to the light-emitting layer.

In one embodiment, in a cross-section of the display panel, a width of a side of the dam structure away from the array substrate is greater than or equal to 6 micrometers.

In one embodiment, a groove is provided in the first dam layer, and the second dam layer is in the groove.

In one embodiment, the plurality of the dam layers on the second dan layer are also in the groove.

In one embodiment, among the plurality of dam layers located on the first dam layer, at least one of the dam layers is provided with a groove, and at least one dam layer is arranged in the groove.

In one embodiment, the dam structure further comprises:

at least one first overflow layer, wherein in at least one set of two adjacent dam layers, the overflow layer at least extends from the side of the dam layer away from the array substrate to the side of the dam wall layer close to the array substrate.

An embodiment of the present application provides a mobile terminal, wherein the mobile terminal comprises a terminal body and any of the previous display panels, and the terminal body and the display panel are combined into one assembly.

In the present application, a display panel and a mobile terminal are provided, and the display panel comprises a display area and a non-display area surrounding the display area, and the display panel comprises: an array substrate; a dam structure, wherein the dam structure is on the array substrate and in the non-display area, the dam structure comprises a plurality of dam layers which are stacked layer by layer, and the plurality of dam layers comprise a first dam layer on the array substrate and a second dam layer on the first dam layer, and a width of the second dam layer is less than or equal to a width of the first dam layer in a cross-section of the display panel; an organic layer group on the array substrate and in the display area, and an absolute value of the difference between a thickness of the organic layer group and a thickness of the dam structure is less than or equal to a first predetermined threshold value; and a light-emitting layer on a side of the organic layer group away from the array substrate and in the display area. In the present application, the width of the second dam layer is set to be less than or equal to the width of the first dam layer, and the absolute value of the difference between the thickness of the organic layer group and the thickness of the dam structure is less than or equal to the first predetermined threshold value as a limitation, that is, the risk of overflow of the film used to form the second dam layer to the film used to form the first dam layer during the fabrication process can be reduced, thereby reducing a risk of the less thickness of the second dam layer, and improves the reliability of the dam structure.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
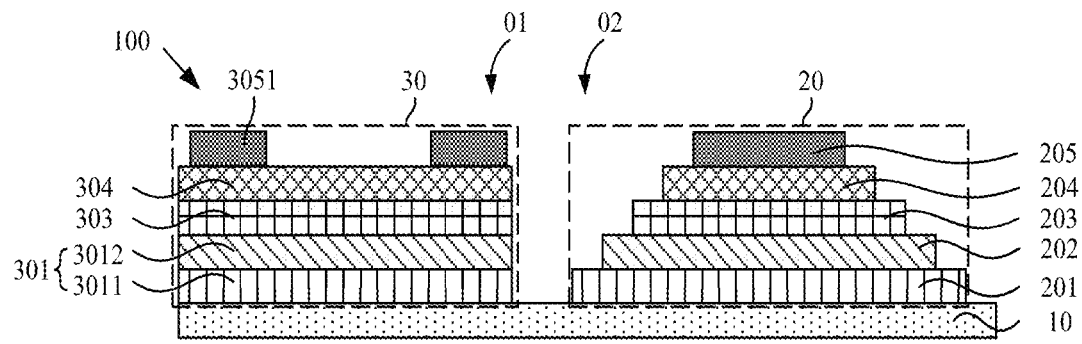
FIG. 1 is a schematic cross-sectional view of a first display panel provided by an embodiment of the application.

The embodiments of the present application provide a display panel and a fabrication method thereof, and a mobile terminal. Detailed descriptions are given below. It should be noted that the order of description in the following embodiments is not intended to limit the preferred order of the embodiments.

In the description of this application, it should be understood that the directions or positional relationships indicated by the terms "upper", "lower", "far away", "near", etc. are based on the directions or positional relationships shown in the drawings, for example, "Upper" only means that the surface is above the object, and specifically refers to directly above, obliquely above, or the upper surface, as long as it is above the level of the object. The upper position or positional relationship is only for the convenience of describing the application and simplifying the description, and is not an indication It may also imply that the device or element referred to must have a specific orientation, be constructed and operated in a specific orientation, and therefore cannot be understood as a limitation of the present application.

In addition, it should be noted that the drawings provide only the structures and steps that are relatively closely related to the application, and omit some details that are not relevant to the application. The purpose is to simplify the drawings so that the application points are clear at a glance, rather than showing the actual device and method are exactly the same as the drawings, and they are not a limitation of the actual device and method.

The present application provides a display panel, which includes but is not limited to following embodiments and combinations between the following embodiments.

In one embodiment, as shown in FIG. 1-6, a display panel 100 comprises a display area 01 and a non-display area 02 surrounding the display area 01. The display panel 100 comprises an array substrate 10 and a dam structure 20. The dam structure 20 is on the array substrate 10 and in the non-display area 02, and the dam structure 20 comprises a plurality of dam layers stacked layer by layer. The plurality of the dam layers comprises a first dam layer 201 on the array substrate 10 and a second dam layer 202 on the first dam layer 201. In a cross-section of the display panel 100, a width of the second dam layer 202 is less than or equal to a width of the first wall layer 201. An organic layer group 30 is on the array substrate 10 and in the display area 01, and an absolute value of a difference between the thickness of the organic layer group 30 and a thickness of the dam structure 20 is less than or equal to a first predetermined threshold value. A light-emitting layer 40 is on a side of the organic layer group 30 away from the array substrate 10 and in the display area 01.

Figure 6:
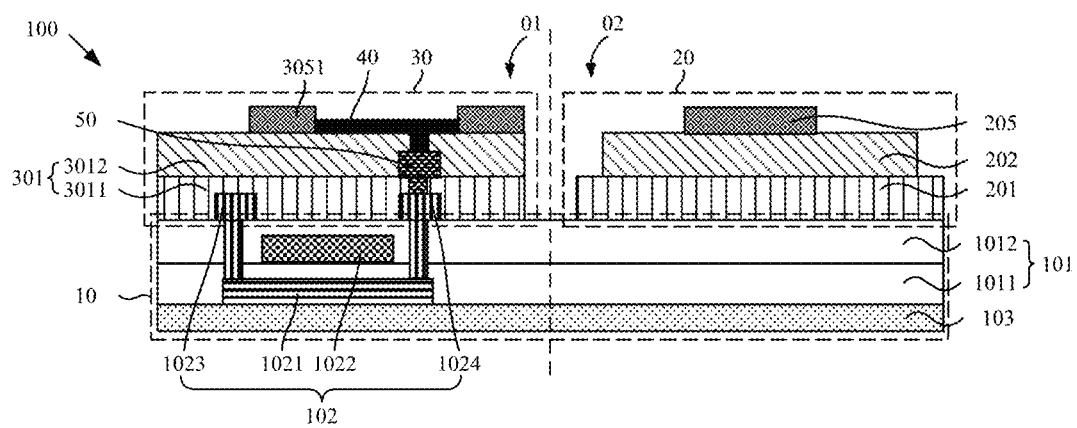
FIG. 6 is a schematic cross-sectional view of a sixth display panel provided by an embodiment of the application.

Herein, the non-display area 02 may be arranged around at least one side of the display area 01, and the dam structure 20 in the non-display area 02 may be arranged along a path that the non-display area 02 surrounds the display area 01. That is, the organic layer group in the display area 01 is surrounded by the dam structure 20. Specifically, as shown in FIG. 6, the array substrate 10 comprises an inorganic layer group 101 and a thin film transistor layer 102 at least located in the inorganic layer group 101. The thin film transistor layer 102 comprises an active layer 1021, a gate layer 1022 on the active layer 1021, and a source 1023 and a drain 1024 on the gate layer 1022. The source 1023 can be electrically connected to a side of the active layer 1021 through a via hole in the inorganic layer group 101, and the drain 1024 can be electrically connected to another side of the active layer 1021 through a via hole in the inorganic layer group 101. The inorganic layer group 101 comprises a first inorganic layer 1011 between the gate layer 1021 and the gate layer 1022, and a second inorganic layer 1012 between the gate layer 1022, the source electrode 1023, and the drain electrode 1024. An anode layer in the light-emitting layer 40 is able to electrically connected the drain 1024 through a via hole in the organic layer group 30. Moreover, the array substrate 10 may further comprise a substrate 103 for carrying the inorganic layer group 101, and the substrate 103 may be a flexible substrate or a rigid substrate.

Specifically, a side of the dam structure 20 close to the array substrate 10 and a side of the organic layer group 30 close to the array substrate 10 may be located on the same horizontal plane. It is noted that the width of the second dam layer 202 is set to be less than or equal to the width of the first dam layer 201 to ensure that a constituent material of the second dam layer 202 will not overflow along a direction toward the first dam layer 201 to lose the thickness of the second dam layer 202.

In one embodiment, as shown in FIGS. 1-6, in a top view of the display panel 100, an edge of the second wall layer 202 overlaps an edge of the first wall layer 201, or an edge of the second dam layer 202 is located within the dam layer 201. It can be understood that, in this embodiment, the side of the second dam layer 202 is set to not exceed the side of the first dam layer 201, that is, a size of the second dam layer 202 is less than a size of the first dam layer 201 in any direction parallel to the array substrate 10, which can further ensure that the constituent material of the second dam layer 202 will not overflow along a direction toward the first dam layer 201 to lose the thickness of the second dam layer 202.

In one embodiment, the predetermined first threshold value in the present application may be less than or equal to 2 micrometers. That is, in this embodiment, it can be achieved through the foregoing embodiment and also defines the absolute value of the difference between the thickness of the organic layer group 30 and the thickness of the dam structure 20 may be less than or equal to 2 micrometers, so that the difference between thereof is small enough or even close to the same. It is understood that, on the one hand, the dam structure 20 can block external moisture from directly entering the display area 01, and prevent organic packaging materials in the display area 01 from overflowing into the non-display area 02, thereby improving a reliability of packaging of the display panel 100. In addition, the dam structure 20 can also support a photomask for a vapor deposition process to prevent the photomask from contacting the plurality of organic layer groups 30 in the display area 01, which may scratch the plurality of the organic layer groups 30.

In one embodiment, as shown in FIGS. 1-6, in a cross-section of the display panel 100, a gap between a side of the second dam layer 202 and a side of the first dam layer 201 is less than or equal to a second predetermined threshold value. It should be noted that, combined with the above description, when the gap between the side of the second dam layer 202 and the side of the first dam layer 201 is too large, the widths of the second dam layer 202 and the dam layer on the second dam layer 202 are too small to support the photomask. Therefore, on the basis of that the width of the second dam layer 202 is less than or equal to the first dam layer 201 in this embodiment, the difference between widths thereof can be further restricted to be reduced, thereby ensuring the width of the second dam layer 202 and the width of the dam layer on the second dam layer 202 are sufficient to support the photomask.

Specifically, each of the organic layer groups 30 and the corresponding dam layer are arranged in the same layer, that is, each of the organic layer groups 30 and the corresponding dam layer can be fabricated at the same time through the same fabrication process. It is noted that, since a size of a projection of the multiple thin layers in the display area 01 on the array substrate 10 is much larger than a size of a projection of the dam structure on the array substrate 10, and a thickness loss caused by a material overflow of the dam structure during the fabrication process is thus more obvious.

Specifically, in a direction from the array substrate 10 to the dam structure 20, the first dam layer 201 and the second dam layer 202 may be two adjacent dam layers among a plurality of the dam layers. In particular, the side of the second wall layer 202 in this embodiment does not exceed the side of the first wall layer 201. That is, a projection of the side of the second dam layer 202 on the array substrate 10 is within a projection of the first dam layer 201 on the array substrate 10, and it also satisfies that an overall size of the multiple dam layers is greater than or equal to an overall size of the multiple film layers on this basis.

In one embodiment, as shown in FIGS. 1-6, in every two adjacent dam layers, a width of the dam layer farther away from the array substrate 10 is less than a width of the dam layer closer to the array substrate 10. In combination with the above description, it can be seen that in any direction parallel to the array substrate 10, the size of the second dam layer 202 is less than the size of the first dam layer 201, and an overall size of the plurality of the dam layers is greater than or equal to an overall size of the multiple film layers, which can reduce the risk that a relative less thickness of the second dam layer 202. Further, in this embodiment, in the direction from the array substrate 10 to the dam structure 20, the sizes of the plurality of dam layers in any direction parallel to the array substrate 10 are sequentially reduced. That is, in every two adjacent dam layers, a projection of the dam layer away from the array substrate 10 on the array substrate 10 is in a projection of the dam layer close to the array substrate 10 on the array substrate 10. It is understood that sizes of the plurality of dam layers is further limited in this embodiment, and for the same reason, the risk of a relive less thickness of the second dam layer 202 and the plurality of the dam layers on the second dam layer is further reduced, thereby improving the reliability of the dam structure 20 in applications.

In one embodiment, as shown in FIGS. 1-6, the organic layer group 30 comprises a planarization layer 301 on a side of the inorganic layer group 101 close to the light-emitting layer 40, a pixel definition layer on a side of the planarization layer 301 close to the light-emitting layer 40, and a supporting layer on a side of the pixel definition layer 302 close to the light-emitting layer 40. Herein, a difference between a gap between a side of the array substate away from the supporting layer to a side of the supporting layer away from the array substrate and a gap between a side of the array substate 10 away from a side of the dam structure 20 and a side of the dam structure 20 away from the array substrate 10 is less than or equal to the first predetermined threshold value.

Specifically, as shown in FIG. 1 to FIG. 6, the planarization layer 301 may be on a side of the source 1023, the drain 1024, and the inorganic layer group 101 close to the light-emitting layer, and the pixel defining layer comprises a plurality of pixel defining portions 3051. A light-emitting layer 40 is provided between two adjacent pixel defining portions, and an anode layer in the light-emitting layer 40 may be connected to the drain 1024 a via hole in the planarization layer 301. The supporting layer may comprise a plurality of supporting portions corresponding to the plurality of pixel defining portions 3051 one by one, and each of the supporting portions is one side of the corresponding pixel defining portion 3051 away from the array substrate 10.

It is understandable that, compared with the above described "an absolute value of a difference between the thickness of the organic layer group 30 and a thickness of the dam structure 20 is less than or equal to a first predetermined threshold value", a specific structure of the organic layer group 30 in this embodiment has been refined, and a thickness of the array substrate 10 has also been considered. A difference between a gap between a side of the array substate away from the supporting layer to a side of the supporting layer away from the array substrate and a gap between a side of the array substate 10 away from a side of the dam structure 20 and a side of the dam structure 20 away from the array substrate 10 is less than or equal to the first predetermined threshold value, so an upper surface of the supporting layer and an upper surface of the dam structure 20 are on the same plane, thereby improving the reliability of the dam structure 20 in applications.

In an embodiment, as shown in FIG. 6, at least one dam layer is provided in at least one of the planarization layers 301, the pixel definition layer, and the support layer, and a constituent material of each dam layer is the same as a constituent material of the planarization layer 301, the pixel definition layer or the support layer provided in the same layer. Specifically, the first dam layer 201 and the second dam layer 202 as a whole can be arranged in the same layer as the planarization layer 301, and constituent materials of these three layers can be the same. A plurality of the pixel defining layers defined by the pixel defining portion 3051 can be arranged in the same layer as the dam layer 205 on the second dam layer 202, and constituent materials of the two layers can be the same. The supporting layer can also be arranged in the same layer as the dam layer on the fifth dam layer 205, and constituent materials of these two layers can be the same.

In one embodiment, as shown in FIG. 6, the planarization layer 301 comprises a first planarization layer 3011 on a side of the inorganic layer group 101 close to the light-emitting layer 40, having a conductive layer 50 on the first planarization layer 3011, and a second planarization layer 3012 on a side of the first planarization layer 3011 and the conductive layer 50 close to the light-emitting layer. Specifically, the conductive layer 50 may be electrically connected to the drain 1024 through a via hole in the first planarization layer 3011, and the anode layer in the light-emitting layer 40 may be electrically connected to the drain 1024 through a via hole in the second planarization layer 3012. A constituent material of the conductive layer 50 is different from and a material of the drain 1024, that is, the second planarization layer 3012 can be used to divide the conductive layer 50 and the layer where the drain 1024 is located.

Specifically, the first dam layer 201 can be provided in the same layer as the first planarization layer 3011 and is made of the same material, and the second dam layer 202 can be provided in the same layer as the second planarization layer 3012 and is made of the same material. Furthermore, as shown in FIGS. 1-6, the organic layer group 30 may further comprise a third organic layer 303 and a fourth organic layer 304 between the planarization layer 301 and the pixel defining layer formed by the plurality of pixel defining portions 3051. Furthermore, the dam structure 20 may also comprise a third dam layer 203 and a fourth dam layer 204 stacked between the second dam layer 202 and the fifth dam layer 205. Herein, the third organic layer 303 and the third dam layer 203 can be arranged in the same layer and made of the same material, the fourth organic layer 304 and the fourth dam layer 204 can be arranged on the same layer and made of the same material. Furthermore, the multiple film layers in the organic layer group 30 may correspond to the multiple dam layers in the dam structure 20 one by one, and each film layer in the organic layer group 30 is arranged on the same layer as the corresponding dam layer.

Figure 2:
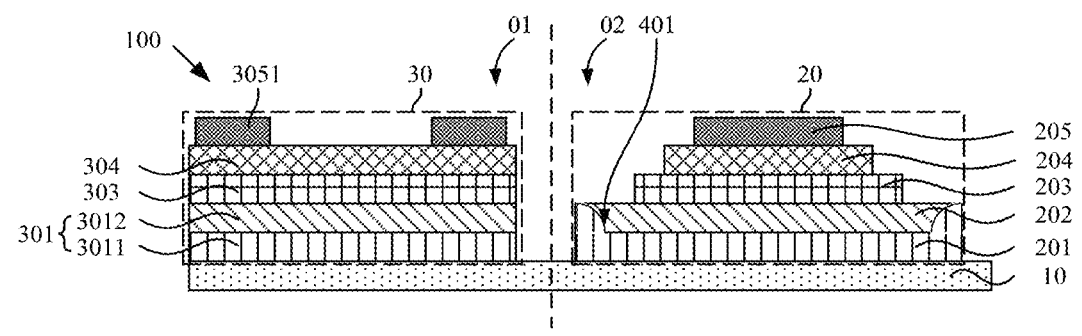
FIG. 2 is a schematic cross-sectional view of a second display panel provided by an embodiment of the application.
Figure 3:
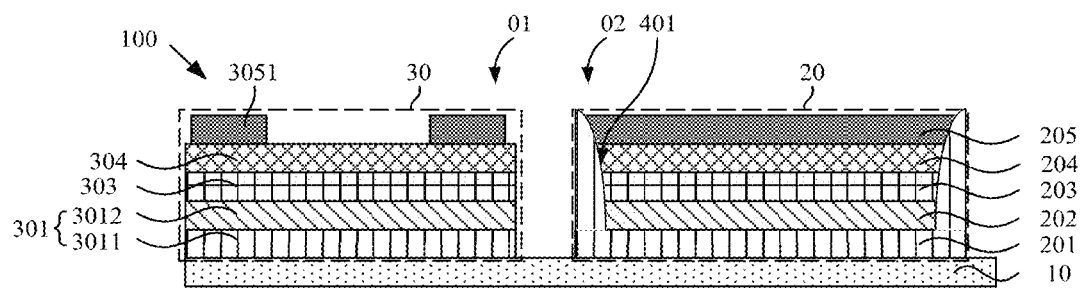
FIG. 3 is a schematic cross-sectional view of a third display panel provided by an embodiment of the application.

In one embodiment, as shown in FIGS. 2-3, the first dam layer 201 is provided with a groove, and the second dam layer 202 is located in the groove. Specifically, the first dam layer 201 may be provided with a first groove 401, and the second dam layer 202 is located in the first groove 401. That is, the first groove 401 can at least receive the second dam layer 202. Furthermore, in the direction from the array substrate 10 to the dam structure 20, the size of the first groove 401 may be greater than or equal to the size of the second dam layer 202.

It is understandable that on the basis that a side of the second dam layer 202 is not beyond a side of the first dam layer 201, the second dam layer 202 in this embodiment is disposed inside the first groove 401. That is, the side of the first dam layer 201 may surround the second dam layer 202. It is known by combining "in the direction from the array substrate 10 to the dam structure 20, the size of the first groove 401 may be greater than or equal to the size of the second dam layer 202" and "in the direction from the array substrate 10 to the dam structure 20, the overall size of the plurality of the dam layers is greater than or equal to the overall size of the multiple film layers", the risk of the film layer forming the second dam layer 202 flows outside the first groove 401 is reduced during formation of the second dam layer 202, thereby reducing the risk of reducing the film used to form the second dam layer 202, and reducing the risk that a less thickness of the second dam layer 202, improving the reliability of the dam structure 20 in applications. Herein, the shape of the first groove 401 is not limited here, and it is necessary to prevent the film used to form the second dam layer 202 from overflowing outside the first groove 401 during the fabrication process.

It should be noted that, as shown in FIG. 2, when at least one dam layer is further provided on the second dam layer 202, the size of the first groove 401 may be equal to the size of the second dam layer 202 in the direction from the array substrate 10 to the dam structure 20. Similarly, furthermore, in every two adjacent dam layers on the second dam layer 202, the side of the dam layer far away from the array substrate 10 may not exceed the side of the dam layer close to the array substrate 10. When the second dam layer 202 is provided with a layer made of a material of poor fluidity, the first groove 401 can also accommodate the layer made of the material with poor fluidity. Furthermore, it is understood that by combining "in the direction from the array substrate 10 to the dam structure 20, the overall size of the multiple dam layers is greater than or equal to the overall size of the multiple film layers", in the direction from the array substrate 10 to the dam structure 20 in this embodiment, the distance between the side of the first dam layer 201 close to the array substrate 10 and the bottom of the first groove 401 may be greater than or equal to the size of the film layer corresponding to the first dam layer 201, thereby avoiding that the distance between the layers the second dam layer 202 and the corresponding film layer is too large in the direction from the array substrate 10 to the dam structure 20, and preventing the distance between the upper surfaces of the plurality of dam layers and the upper surfaces of the plurality of film layers from being too large.

In one embodiment, as shown in FIG. 3, a plurality of the dam layers on the second dam layer 202 are also in the grooves. Specifically, in combination with the above description, it can be seen that the side of the first groove 401 in this embodiment can surround the second dam layer 202 and the plurality of dam layers on the second dam layer. That is, the size of the first groove 401 may be greater than or equal to the overall size of the second dam layer 202 and the multiple dam layers on the second dam layer 202 in the direction from the array substrate 10 to the dam structure 20.

Similarly, on the basis that the side of the second dam layer 202 does not exceed the side of the first dam layer 201, the second dam layer 202 and the plurality of the dam layers on the second dam layer 202 in this embodiment are in the first groove 401. In combination with the above description, the risk of the multiple film layers used to form the second dam layer 202 and the plurality of dam layers on the second dam layer 202 overflowing outside the first groove 401 can be reduced during the process of forming the second dam layer 202 and the plurality of dam layers on the second dam layer 202, thereby reducing the risk of forming the second dam layer 202 and the plurality of dam layers located on the second dam layer 202, and improving the working reliability of the dam structure 20. Similarly, the shape of the first groove 401 is not limited here, and it needs to meet the requirement of avoiding the thin film used to form the second dam layer 202 and the excessive amount on the second dam layer 202 from overflowing to the outside of the first groove 401 during the fabrication process.

Figure 4:
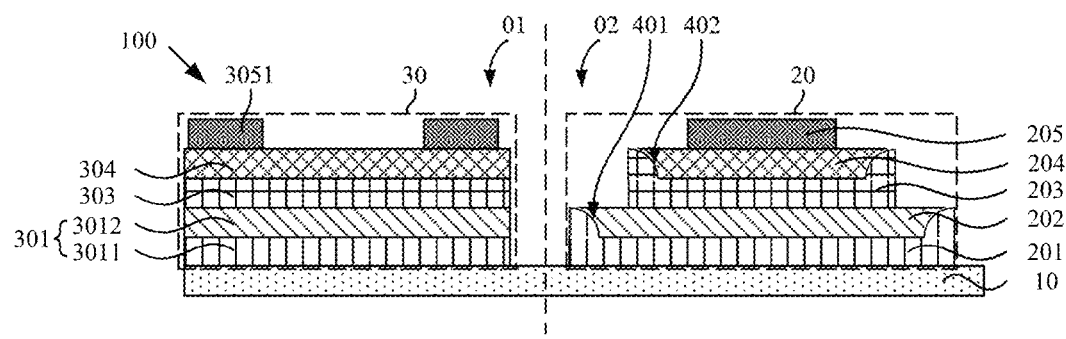
FIG. 4 is a schematic cross-sectional view of a fourth display panel provided by an embodiment of the application.

In one embodiment, as shown in FIG. 4, among the plurality of dam layers on the first dam layer 201, at least one of the dam layers is provided with a groove, and the groove is provided with at least one of the dam layers therein. Specifically, among the plurality of dam layers on the first dam layer 201, at least one of the dam layers is provided with a second groove 402, and the second groove 402 is provided with at least one of the dam layers. That is, the second groove 402 may be opened in any one of the dam layers except the first dam layer 201 and the dam layer located on the top layer.

Similarly, the shape of the second groove 402 is not limited here, and it needs to meet the requirement of preventing the film used to form the dam layer in the second groove 402 from overflowing to outside the second groove 402. In the same way, in the direction from the array substrate 10 to the dam structure 20 in this embodiment, the distance from the side of the dam layer with the second groove 402 close to the array substrate 10 to the bottom of the second groove 402 may be greater than or equal to the size of the film layer corresponding to the dam layer on which the second groove 402 is formed, so as to avoid the distance between the dam layer located in the second groove 402 and the corresponding film layer is too large, to avoid the distance between the upper surfaces of the film layers and the upper surface of multiple dam layers is too large. Similarly, when part of the dam layer is provided in the second groove 402, the dam layer on the second groove 402 can extend into the second groove 402, but the side of the dam layer on the second groove 402 may not exceed the side of the second groove 402 to avoid the film used to form the dam on the second groove 402 from overflowing to the side of the second groove 402.

It can be understood that, compared with the embodiment shown in FIG. 3, in this embodiment, in addition to the first groove 401, a second groove 402 is also provided in at least one of the dam layers located on the first dam layer 201. That is, under the premise that multiple layers of the dam layer are provided in the first groove 401 and the second groove 402, in this embodiment, due to the presence of the second groove 402, the size of the first groove 401 in the direction from the array substrate 10 to the dam structure 20 can be set less, which can avoid spending more time on etching more materials used to form the first groove 401 as shown in FIG. 3, which improves the fabrication efficiency of the display panel 100.

In one embodiment, in the cross section of the display panel 100, the width of the side of the dam structure 20 away from the array substrate 10 is greater than or equal to 6 micrometers. In combination with the above description, as shown in FIGS. 1-4, a light-emitting layer 40 may be provided between two adjacent pixel defining portions 3051. When the light-emitting layer 40 is formed by evaporation, the dam structure 20 and the plurality of support portions located on the plurality of pixel defining portions 3051 can support the photomask so that the light-emitting material is deposited on the plurality of pixel defining portions 3051 by the via holes defined in the photomask.

It is understandable that on the basis that the width of the second dam layer 202 is less than or equal to the width of the first dam layer 201. In this embodiment, the size of the upper surface of the dam structure 20 in the direction from the display area 01 to the non-display area 02 is set to be greater than or equal to 6 micrometers, which can make the size of the upper surface of the dam structure 20 large enough to better control the mask process and further reduce the light, thereby reducing a risk of scratching the array substrate 10 when the cover is resting on the non-display area 02. Of course, the minimum size of the upper surface of the dam structure 20 in the direction from the display area 01 to the non-display area 02 can also be set in combination with the sizes of the upper surfaces of multiple film layers.

Furthermore, the constituent material of the plurality of dam layers is the same as the constituent material of the organic layer group 30. Specifically, the display area 01 comprises a light-transmitting area, an optical device and a plurality of transparent conductive layers arranged in the light-transmitting area. A set of organic layers is provided between two adjacent transparent conductive layers 30, the constituent material of the organic layer group 30 comprises an insulating material, and the film layer in the organic layer group 30 is used to insulate the corresponding two transparent conductive layers. It can be seen in combination with the above description that because the multiple film layers in the display area 01 are formed by at least one process. Correspondingly, the multiple dam layers in the non-display area 02 are also formed by at least one process. Each of the dam layers can be formed by at least one process and the corresponding film layer is fabricated at the same time. It is understandable that in this way, multiple dam layers can be formed at the same time as the organic layer group 30 is formed, which improves the fabrication efficiency of the display panel 100.

Furthermore, the constituent materials of the plurality of the dam layers and the constituent materials of the organic layer group 30 may be organic materials. It can be understood that due to the strong fluidity of organic materials, in the process of forming multiple dam layers and organic layer groups 30, organic materials will overflow from the center to the side, so at least an angle between the side of the dam layer and the bottom near the array substrate 10 may be an acute angle. Similarly, the angle between the side of at least one film layer and the bottom near the array substrate 10 may be an acute angle. It should be noted that this is determined by the characteristics of organic materials and is not the original intention of this embodiment. On the contrary, at least one of the sides of the dam layer and the bottom of the array substrate 10 are clamped. The angle presented as an acute angle will cause the area of the side of the dam layer to increase. In the process of forming the dam layer, it will promote the overflow of the film forming the dam layer in the direction close to the bottom 10, which is not conducive to the production of related embodiments in this application.

Figure 5:
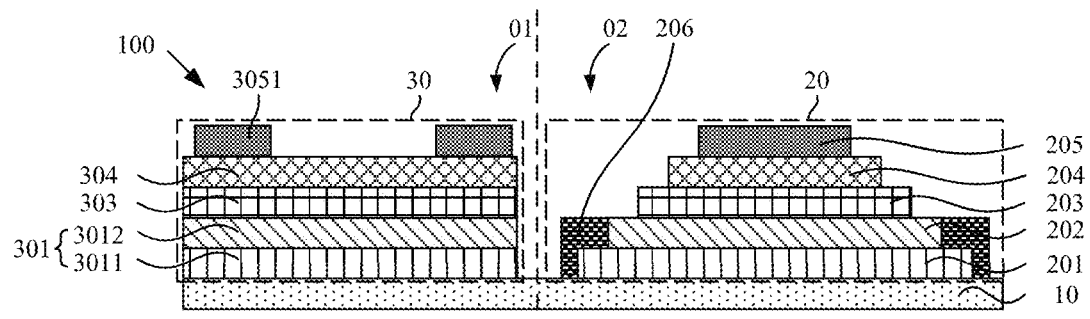
FIG. 5 is a schematic cross-sectional view of a fifth display panel provided by an embodiment of the application.

In one embodiment, as shown in FIG. 5, the dam structure 20 further comprises at least a first overflow layer 206. In at least one set of two adjacent dam layers, the overflow layer 206 is far away from the wall. The side portion of the dam layer of the array substrate 10 extends at least to the side portion of the dam layer close to the array substrate 10. Based on the above description, it can be seen that the organic material has strong fluidity, so the overflow layer 206 may be formed on the sides of the two adjacent dam layers. It should be noted that this is determined by factors such as the characteristics of organic materials and process accuracy, and is not the original intention of this embodiment. On the contrary, the existence of the overflow layer 206 will cause the corresponding dam layer to be in the array. The size in the direction from the substrate 10 to the dam structure 20 is reduced, which is actually not conducive to the implementation of the related embodiments in this application. It is understandable that it is stated here that the above-mentioned dam structure 20 including the above-mentioned overflow layer 206 caused by the above-mentioned uncontrollable reasons also belongs to the protection scope of the present application.

It should be noted that for the two adjacent dam layers, if the side of the dam layer located above and the side portion of the dam layer located below are closer in the fabrication process, the film used for forming the upper dam layer will overflow to the lower dam layer to form the overflow layer 206. Even if the side of the upper dam layer and the side of the lower dam layer are produced during the production process, the distance between the two parts is relatively long, and the distance between the two here may not be less than 1.5 micrometers, but due to process accuracy or other external interference, the existence of the overflow layer 206 may also be caused. Specifically, the overflow layer 206 extends from the side of the second dam layer 202 to the side of the first dam layer 201 as an example for illustration. According to the above description, it can be seen that the constituent material of the overflow layer 206 and the constituent material of the second dam layer 202 may be the same.

Figure 7:
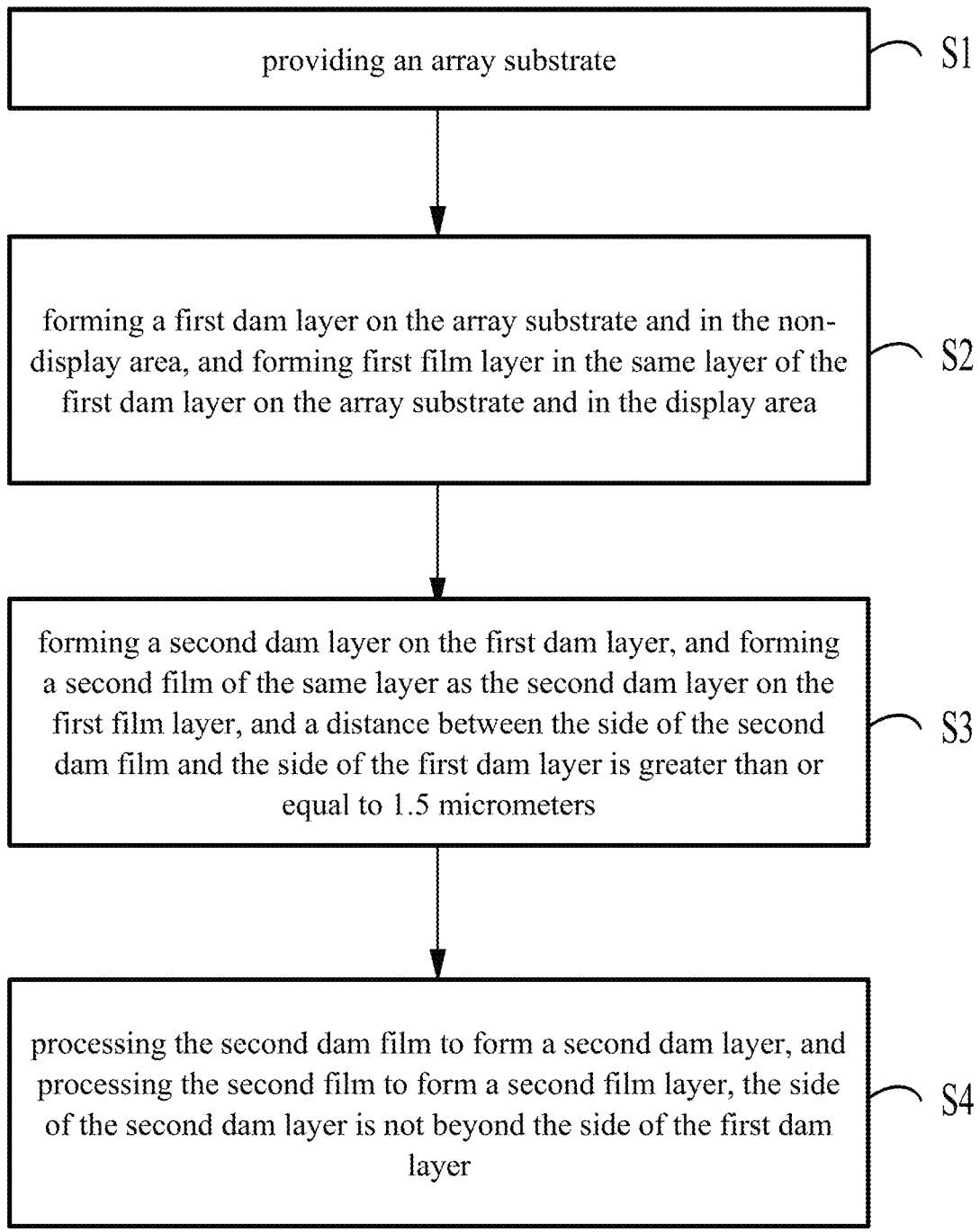
FIG. 7 is a flowchart of a fabrication method of a display panel provided by an embodiment of the application.

The present application provides a fabrication method for a display panel. The display panel comprises a display area and a non-display area surrounding the display area. As shown in FIG. 7, the fabrication method for the display panel comprises the following steps and one of the combinations between the following steps, but not limited to.

Step S1: providing an array substrate.

Herein, the array substrate may comprise but is not limited to one layer, the array substrate may comprise a circuit layer, and the constituent material of the circuit layer may comprise a metal material.

Step S2: forming a first dam layer on the array substrate and in the non-display area, and forming first film layer in the same layer of the first dam layer on the array substrate and in the display area.

Herein, the display area comprises a light-transmitting area, an optical device and a transparent conductive layer arranged in the light-transmitting area. The first film layer may be located on the transparent conductive layer, and the constituent material of the first film layer comprises an insulating material, and the first film layer is used to insulate the transparent conductive layer and other conductive film layers. Specifically, the first dam layer and the first film layer may be simultaneously fabricated by patterning, and the constituent material of the first dam layer may be the same as the constituent material of the first film layer. It is understandable that in this way, the first dam layer can be formed at the same time as the first film layer is formed, which improves the fabrication efficiency of the display panel.

Step S3: forming a second dam layer on the first dam layer, and forming a second film of the same layer as the second dam layer on the first film layer, and a distance between the side of the second dam film and the side of the first dam layer is greater than or equal to 1.5 micrometers.

Similarly, the second dam film and the second film can be fabricated simultaneously by patterning, and the constituent material of the second dam film can be the same as the constituent material of the second film. It should be noted that setting the distance between the side of the second dam film and the side of the first dam layer to be greater than or equal to 1.5 micrometers can make the distance between the side of the second dam film and the side of the first dam layer is relatively large, which reduces the risk of overflowing of the second dam film to the first dam layer.

Step S4: processing the second dam film to form a second dam layer, and processing the second film to form a second film layer, the side of the second dam layer is not beyond the side of the first dam layer.

Herein, the second dam film and the second film can be dried naturally or artificially to form the second dam layer and the second film layer, so that the side of the second dam layer does not exceed the side of the first dam layer. In the same way, combined with the above description, it can be known that due to process accuracy or other external interference, an overflow layer may be formed, and the overflow layer extends from the side of the second dam layer to the side of the first dam layer. The constituent material of the overflow layer and the constituent material of the second dam layer may be the same.

The present application provides a mobile terminal. The mobile terminal comprises a terminal body and a display panel as described above, and the terminal body and the display panel are combined into one assembly.

In the present application, a display panel and a mobile terminal are provided, and the display panel comprises a display area and a non-display area surrounding the display area, and the display panel comprises: an array substrate; a dam structure, wherein the dam structure is on the array substrate and in the non-display area, the dam structure comprises a plurality of dam layers which are stacked layer by layer, and the plurality of dam layers comprise a first dam layer on the array substrate and a second dam layer on the first dam layer, and a width of the second dam layer is less than or equal to a width of the first dam layer in a cross-section of the display panel; an organic layer group on the array substrate and in the display area, and an absolute value of the difference between a thickness of the organic layer group and a thickness of the dam structure is less than or equal to a first predetermined threshold value; and a light-emitting layer on a side of the organic layer group away from the array substrate and in the display area. In the present application, the width of the second dam layer is set to be less than or equal to the width of the first dam layer, and the absolute value of the difference between the thickness of the organic layer group and the thickness of the dam structure is less than or equal to the first predetermined threshold value as a limitation, that is, the risk of overflow of the film used to form the second dam layer to the film used to form the first dam layer during the fabrication process can be reduced, thereby reducing a risk of the less thickness of the second dam layer, and improves the reliability of the dam structure.

The display panel and mobile terminal provided by the embodiments of the application are described in detail above. Specific examples are used in this article to explain the principles and implementations of the application. The descriptions of the above embodiments are only used to help understand the technology of the application. The solution and its core idea; those of ordinary skill in the art should understand that it is still possible to modify the technical solutions recorded in the foregoing embodiments, or equivalently replace some of the technical features; and these modifications or replacements do not make the essence of the corresponding technical solution deviates from the scope of the technical solution of each embodiment of the present application.

What is claimed is:

1. A display panel comprising a display area and a non-display area surrounding the display area, wherein the display panel comprises:
    an array substrate;
    a dam structure, wherein the dam structure is on the array substrate and in the non-display area, the dam structure comprises a plurality of dam layers which are stacked layer by layer, and the plurality of dam layers comprise a first dam layer on the array substrate and a second dam layer on the first dam layer; wherein a width of the second dam layer is less than or equal to a width of the first dam layer in a cross-section of the display panel, a first groove is provided in the first dam layer, and the second dam layer is in the first groove of the first dam layer;
    an organic layer group on the array substrate and in the display area, and an absolute value of a difference between a thickness of the organic layer group and a thickness of the dam structure is less than or equal to a first predetermined threshold value; and
    a light-emitting layer on a side of the organic layer group away from the array substrate and in the display area.

2. The display panel of claim 1, wherein an inner sidewall of the first groove is a convex surface.

3. The display panel of claim 1, wherein the plurality of the dam layers on the second dam layer are further disposed in the first groove.

4. The display panel of claim 1, wherein among the plurality of the dam layers located on the first dam layer, at least one of the dam layers is provided with a second groove, and at least one dam layer is arranged in the second groove.

5. The display panel of claim 1, wherein the dam structure further comprises a third dam layer, a fourth dam layer, and a fifth dam layer arranged on the second dam layer in sequence; and
    wherein a width of the second dam layer, a width of the third dam layer, a width of the fourth dam layer, and a width of the fifth dam layer decrease successively; and the second dam layer and the third dam layer form a first step, the third dam layer and the fourth dam layer form a second step, and the fourth dam layer and the fifth dam layer form a third step.

6. The display panel of claim 1, wherein the dam structure further comprises a third dam layer, a fourth dam layer, and a fifth dam layer arranged on the second dam layer in sequence; and
    wherein the third dam layer, the fourth dam layer, and the fifth dam layer are further disposed in the first groove.

7. The display panel of claim 1, wherein the dam structure further comprises a third dam layer, a fourth dam layer, and a fifth dam layer arranged on the second dam layer in sequence; and
    wherein a width of the second dam layer is greater than a width of the third dam layer, and the second dam layer and the third dam layer form a first step;
    a second groove is provided in the third dam layer, and the fourth dam layer is disposed in the second groove;

a width of the fourth dam layer is greater than a width of the fifth dam layer, and the fourth dam layer and the fifth dam layer form a third step.

8. The display panel of claim 1, wherein the first predetermined threshold value is less than or equal to 2 micrometers.

9. The display panel of claim 1, wherein in every two adjacent dam layers, a width of the dam layer far from the array substrate is less than a width of the dam layer closer to the array substrate.

* * * * *